United States Patent
Kim et al.

(10) Patent No.: US 7,145,829 B1
(45) Date of Patent: Dec. 5, 2006

(54) SINGLE CYCLE REFRESH OF MULTI-PORT DYNAMIC RANDOM ACCESS MEMORY (DRAM)

(75) Inventors: Hoki Kim, Hopewell Junction, NY (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,273

(22) Filed: Jun. 16, 2005

(51) Int. Cl.
C11C 7/00 (2006.01)
(52) U.S. Cl. ............... 365/222; 365/230.05; 365/236; 365/189.05; 365/233
(58) Field of Classification Search .......... 365/230.05, 365/222, 236, 189.05, 189.07, 233
See application file for complete search history.

(56) References Cited

U.S. PATENT DOCUMENTS

| | | | |
|---|---|---|---|
| 5,923,593 A | 7/1999 | Hsu et al. ............. | 365/189.04 |
| 5,963,497 A | 10/1999 | Holland ................ | 365/222 |
| 6,091,429 A * | 7/2000 | Yassaie et al. ......... | 345/546 |
| 6,144,608 A | 11/2000 | Artieri ................ | 365/230.05 |
| 6,222,786 B1 | 4/2001 | Holland et al. ......... | 365/222 |
| 6,229,749 B1 * | 5/2001 | Cowles et al. .......... | 365/222 |
| 6,310,819 B1 * | 10/2001 | Cowles et al. .......... | 365/230.06 |
| 6,519,176 B1 | 2/2003 | Hamzaoglu et al. ...... | 365/154 |
| 6,724,649 B1 | 4/2004 | Ye et al. .............. | 365/154 |
| 6,731,566 B1 | 5/2004 | Sywyk et al. .......... | 365/230.05 |
| 6,738,306 B1 | 5/2004 | McLaury .............. | 365/230.05 |
| 2006/0133173 A1 * | 6/2006 | Jain et al. ............ | 365/222 |

* cited by examiner

Primary Examiner—Andrew Q. Tran
(74) Attorney, Agent, or Firm—Lisa U. Jaklitsch

(57) ABSTRACT

A multi-port DRAM having refresh cycles interleaved with normal read and write operations implements a single cycle refresh sequence by deferring the write portion of the sequence until the next refresh cycle. During a single clock cycle, the system writes stored data from a refresh buffer into a row in the memory array and then reads data from one row of the memory array into the buffer.

20 Claims, 3 Drawing Sheets

SINGLE CYCLE REFRESH OF MULTI-PORT DYNAMIC RANDOM ACCESS MEMORY (DRAM)

TECHNICAL FIELD

The field of the invention is that of multi-port dynamic random access memory.

BACKGROUND OF THE INVENTION

FIG. 1 illustrates a conventional 1T, 1C DRAM cell 10 that contains a capacitor 12 for storing the data and a pass transistor 11 controlled by a Word Line (WL) that connects the storage node to the Bitline (BL). The charge stored on the capacitor will, of course, leak away and the charge must be refreshed. The refresh cycle consists of a read operation that destructively reads the stored data followed by a write operation that writes the data back in the cell with the maximum charge that the apparatus allows. As is well known, the cell may not be written to or read from during the course of the refresh operation.

FIG. 2 shows a transistor level schematic of a multi-port 3T1C DRAM gain cell. These cells may be written to and read from independently, since they have separate read and write ports (a read port with a Read Word Line, RWL, and a Read Bitline, RBL, and a write port with a Write Word Line, WWL, and a Write Bitline, WBL). They also must be refreshed, since the data bit is also stored in a capacitor that has a finite leakage.

The NMOS transistor 24 couples the storage node 22 to the write bitline WBL for a write operation, when the write wordline WWL goes high. The storage node 22 may preferably have a capacitor 25 to keep the data bit. The data bit stored in a storage node 22 can be read out to the read bitline RBL when the read wordline RWL goes high. If the storage node 22 keeps a high data, two NMOS transistors 21 and 23 are both on, discharging the RBL. If the storage node keeps a low voltage, the NMOS transistor 23 is off, keeping the RBL at the precharged voltage.

The 3T gain cell can simultaneously realize a read operation by using RWL and RBL, and a write operation by using WWL and WBL, thereby providing a solution for a high performance memory system. It does, however, require a refresh to maintain the data. Unlike a conventional 1T cell in FIG. 1, the 3T gain cell requires to read the data bit first by activating a RWL, and then rewrite a data bit to the cell by activating WWL. This results in a 2 cycle refresh, reducing memory availability.

The art could benefit from a 3T1C cell that has a single cycle refresh mode that improves the memory availability for normal read and write operations.

SUMMARY OF THE INVENTION

The invention relates to a single cycle refresh management for a 3T1C gain cell dual-port memory that defers the write back portion of the sequence until the next refresh cycle, thereby taking only one clock cycle by performing the write operation of the kth refresh during the same clock cycle as the read operation of the (k+1)th refresh.

DETAILED DESCRIPTION

Figure 5:
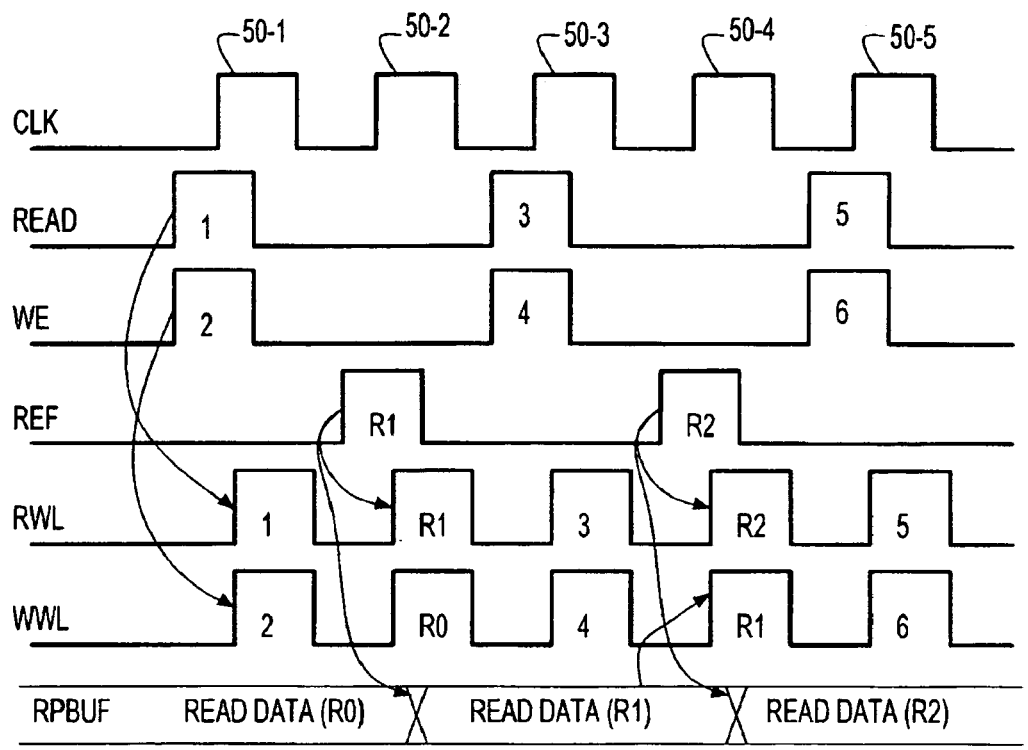
FIG. 5 shows timing relationships in the refresh sequence.

FIG. 5 shows a set of pulse trains used with the invention that illustrates the times when the normal read and write operations and the refresh read and write operations take place.

On the top row, the CLK signals 50-1, - - - 50-5 mark off a sample of clock pulses that illustrate the operations of the system. Lines 2 and 3 show the timing of normal read and write operations to the memory. Read operations (READ), denoted with numerals 1, 3 and 5 representing read row addresses, and write operations (WE), denoted with 2, 4, 6, representing write row addresses, may both take place during the same clock cycle. Arrows extending from lines 2 and 3 to lines 5 and 6, respectively, denote that RWL and WWL are each activated within the same clock cycle as the corresponding read and write enable signals.

It is apparent on lines 5 and 6 that the refresh cycles are inserted among, the normal read and write cycles. It is also evident that the refresh cycle R1, which starts on clock cycle 50-2 is half completed within the same clock cycle, but is not fully completed until clock cycle 50-4, when the second half of refresh cycle R1 takes place.

Within clock cycle 50-2, WWL is activated to write the contents of the RPBUF (Read Page Buffer, stores the read data temporarily) to the memory row flagged during the preceding refresh cycle R0 preceding the row flagged in cycle R1. A slight skew, not shown in the figure, separates the write and read operations in time, so that the contents of RPBUF are read out into the appropriate row and the circuits have stabilized before the read operation loads the contents of the next row into RPBUF, thus avoiding contamination of the read-in data.

A single cycle refresh is realized by delaying a write function till the next cycle. A refresh row address counter (RAC) shown in FIG. 4 generates addresses n and n−1 for RWL and WWL respectively for each refresh cycle. When a refresh command is received, row n is read out and stored in RPBUF. Data conversion logic is included in RPBUF to keep the write back data polarity consistent with the read data polarity. The data bits are held in the RPBUF until the next refresh cycle, at which time the data in the RPBUF is written back to the appropriate row in the array. The non-destructive read feature of the memory cell allows for reading the data bits even if a read command is received for the row address of the data held in a RPBUF. The additional refresh interval required for the cell by this feature is less than 1% of the total retention requirement as long as distributed refresh is used.

When a write command is received for the data in the RPBUF, write data will be written for the corresponding row in the array and RPBUF avoiding the possible complexities when a read after write operation for the data held in RPBUF is performed. The data path from write data pad to RPBUF is controlled by the Hit signal in block 350 of FIG. 3. The Hit signal is created as shown in FIG. 4 by comparing the refresh address with the write address of a normal write. Thus, even if a write command is executed during the refresh latency period of two clock cycles, the refresh write operation that is the second part of the refresh operation is suppressed, so that the new data in the memory array is not overwritten by the data from RPBUF. This assures data consistency when writing to an address that is in the midst of a refresh. The timing diagram in FIG. 5 shows that the write operation of refreshing address R1 is separated from read operation by the refresh latency period (command interval) and done when the next refresh read operation of R2 starts.

FIG. 4 shows the RAC 415 which increments the row number of the next row to be refreshed. In operation, the REF command will enable the transfer of the next row address to be read on line 434 and the next address to be written on line 432. As discussed above, comparator 420 generates a hit signal when the next write address during the refresh latency period is the same as the next refresh write address (N–1) to be written during next refresh command cycle. The illustrative example is non-multiplexed column architecture. All cells with a particular wordline will be read or written at one cycle. Those skilled in the art will appreciate that there are many ways to preserve the data in the other columns; i.e. resetting the row address counter to repeat the read operation on row (N–1) and then read the recently read data into the (N–1)th row. This repeated read may be done at any convenient time, not necessarily on the next refresh cycle. Alternatively, straightforward logic may be used to keep track of the columns written to during the latency period and refresh only the columns that are not written to in that period.

Figure 1:
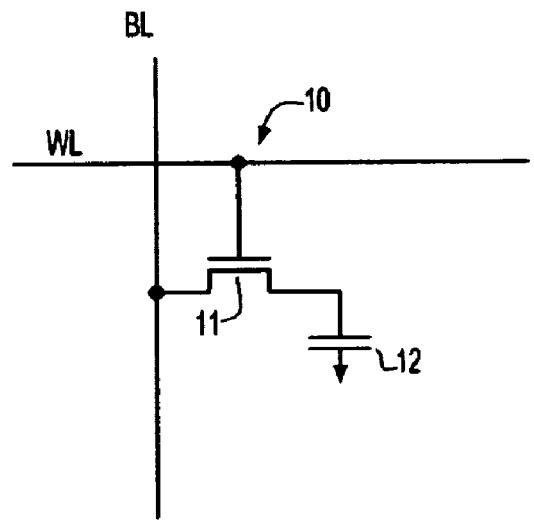
FIG. 1 shows a schematic of a 1T1C DRAM cell.
Figure 2:
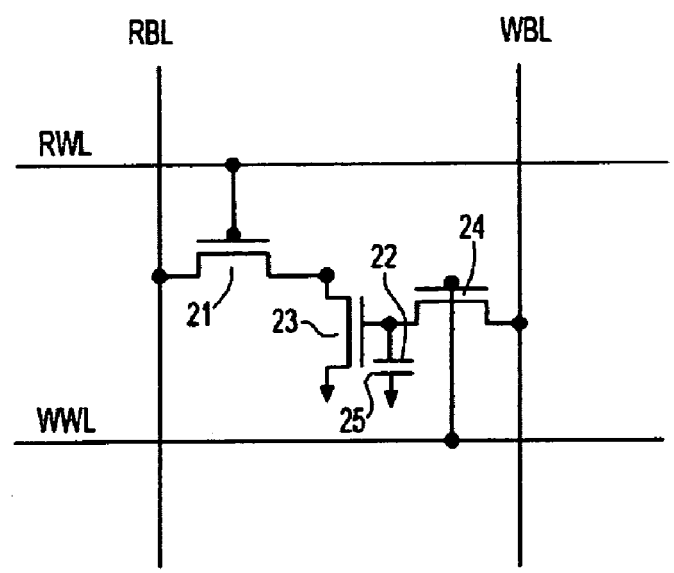
FIG. 2 shows a schematic of a 3T1C DRAM cell for use with the invention.
Figure 3:
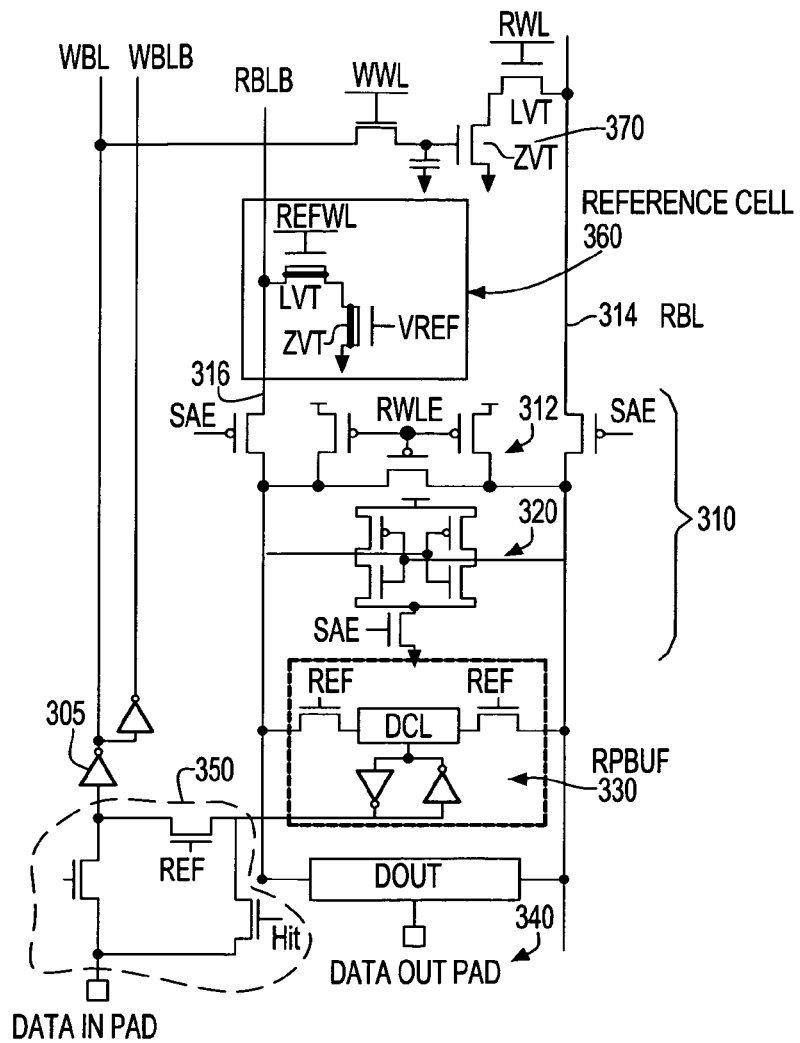
FIG. 3 shows a peripheral circuit including sense amp, cell driver and refresh buffer.
Figure 4:
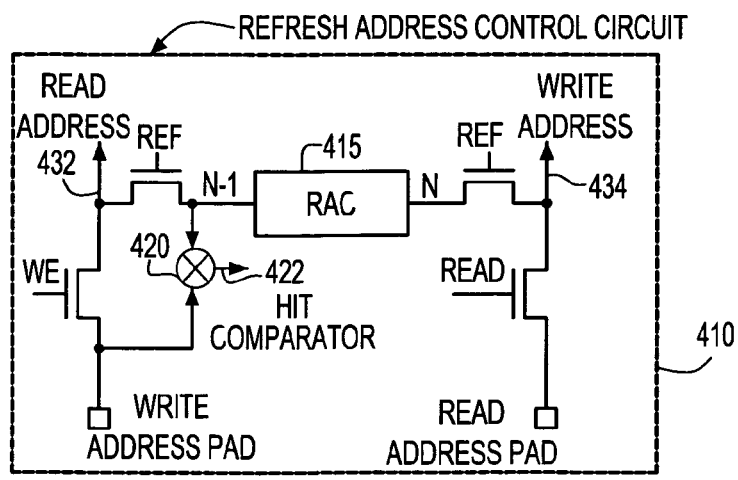
FIG. 4 shows a detail of the counter arrangement for the refresh operation.

Referring now to FIG. 3, there is shown a combined peripheral circuit that connects to columns of the memory array. Most of the elements of FIG. 3 comprise a sense amplifier denoted with bracket 310 that further contains unit 312 that equalizes and precharges the bitlines RBL and RBLB, 314 and 316, respectively. Cross coupled inverters 320 perform the usual function of responding to a difference on the bitlines to drive the lines to a higher voltage. Reference cell 360 maintains a reference voltage that is preferably half way between the bitline voltage associated with a logical 1 in the selected cell and the voltage associated with a logical 0 in the cell.

Unit 370 is a reference cell which provides a reference voltage level to the RBLB, which are the inputs to sense amplifier together with RBL. The reference cell consists of the same memory cell as normal 3T1C cell by skipping the write access transistor. The read head transistor (designated ZVT) gate is tied to VREF, which is an external voltage supply. The VREF is the average value of GND and VDD.

Unit 330 contains the Data Conversion Logic (DCL) and stores the data from the memory cell in question as part of RPBUF It manages the write back data polarity when we read and write back to the cells. Because the read bitline and write bitlines are twisted one and twice respectively, the read data in RPBUF needs to keep track of the data and address scramble to correctly maintain the data in the cells.

At the bottom of the Figure, unit 340 contains a conventional latch DOUT that stores and sends out the data that is read out in normal operation, and keeps the data to be fetched even after RBL and RBLB go back to the precharge state "High".

On the left side of FIG. 3, a driver circuit writes data to the cell that has been activated on bitlines WBL and WBLB. In the example illustrated here, only one WBL is used, but some memory architectures may use two bitlines for a purpose that is outside the scope of the present invention.

As discussed above, unit 350 maintains the data consistency between array and RPBUF by simultaneously writing the new write data in both array and RPBUF when the Hit signal is active. Ordinarily, the bitline driver will be fed by data from the Data pad when the WE signal is high and fed from unit 330 when the REF signal is high.

Figure 6:
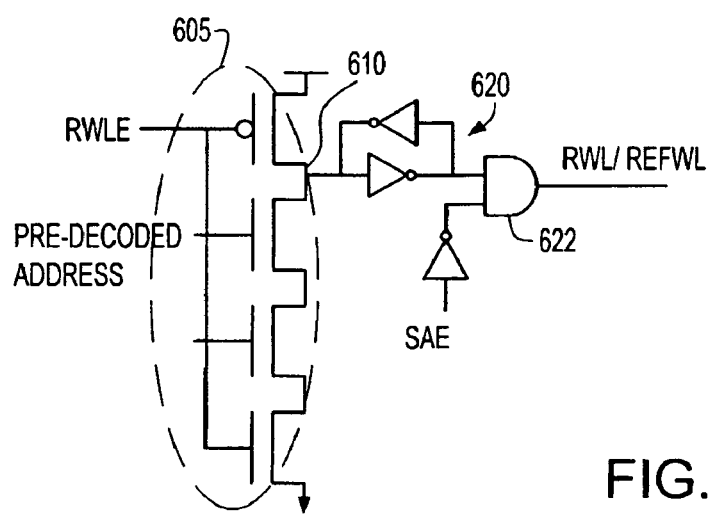
FIG. 6 shows row decoder and word line driver for RWL, REFWL and WWL.

FIG. 6 shows a decoder that generates RWL, REFWL and WWL signals from the read row address and write row address, respectively. The decoding is done in subcircuit 305, controlling node 310.

Those skilled in the art will appreciate that the ratio of refresh cycles to ordinary read and write operations will vary with different products and as the technology changes. In particular, the retention time of charge in a cell will determine the overall frequency of the interval between refresh operations.

While the invention has been described in terms of a single preferred embodiment, those skilled in the art will recognize that the invention can be practiced in various versions within the spirit and scope of the following claims.

What is claimed is:

1. A random access memory system comprising:
   an array of dual-port dynamic memory cells having a storage node connected to a first pass transistor that is controlled by a write word line and further connected to a write bitline, said storage node further being connected to the gate of a first read transistor that is connected in series between a voltage supply and a read pass transistor, said read pass transistor being further connected to a read bitline and having a gate controlled by a read word line; and
   support circuits for said array, including refresh means for refreshing cells in said array comprising a counter for specifying a next row to be refreshed and a storage buffer for storing the contents of a last row to be read, in which the stored contents of an (n–1)th row of the array are written back from the storage buffer into the cells of the (n–1)th row of the array after a refresh latency period and during the same clock cycle that the contents of the nth row are written into the storage buffer.

2. A memory according to claim 1, in which said refresh means reads data from a selected row into said storage buffer in a first clock cycle of a refresh cycle and writes back said data from said storage buffer to said selected row in a second clock cycle of the refresh cycle, said first and second clock cycles of the refresh cycle being separated in time by the refresh latency period.

3. A memory according to claim 2, in which said first and second clock cycles of the refresh cycle are interspersed among a set of normal read and write cycles.

4. A memory according to claim 3, in which said stored contents of an (n–1)th row are written from said storage buffer into said array before the contents of the nth row of said array are read into said storage buffer.

5. A memory according to claim 4, in which the row address of the (n–1)th row in the storage buffer is compared with the row address of data written into the array during the refresh latency period and the operation of writing back the stored contents of an (n–1)th row of the array from the storage buffer into the cells of the (n–1)th row of the array is suppressed when a write operation has taken place writing data into the (n–1)th row of the array during the latency period.

6. A memory according to claim 3, in which the row address of the (n–1)th row in the storage buffer is compared with the row address of data written into the array during the refresh latency period and the operation of writing back the stored contents of an (n–1)th row of the array from the storage buffer into the cells of the (n−1)th row of the array is suppressed when a write operation has taken place writing data into the (n−1)th row of the array during the latency period.

7. A memory according to claim 2, in which said stored contents of an (n−1)th row are written from said storage buffer into said array before the contents of the nth row of said array are read into said storage buffer.

8. A memory according to claim 7, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

9. A memory according to claim 2, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

10. A memory according to claim 1, in which said stored contents of an (n−1)th row are written from said storage buffer into said array before the contents of the nth row of said array are read into said storage buffer.

11. A memory according to claim 10, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

12. A memory according to claim 1, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

13. A method of refreshing a random access memory system having an array of dual-port dynamic memory cells having a storage node connected to a write bitline, said storage node further being connected to the gate of a first read transistor that is connected in series to a read bitline; and support circuits for said array, including refresh means for refreshing cells in said array comprising a counter for specifying a next row to be refreshed and a storage buffer for storing the contents of a last row to be read, comprising the steps of:

writing back stored contents of an (n−1)th row of the array from the storage buffer into the cells of the (n−1)th row of the array after a refresh latency period and during the same clock cycle that the contents of the nth row are written into the storage buffer; and suppressing in a write suppress means the writing of at least the contents of those cells of said storage buffer that correspond to memory cells that have been written into after said (n−1)th row has been read.

14. A method according to claim 13, in which said refresh means reads data from a selected row into said storage buffer in a first clock cycle of a refresh cycle and writes back said data from said storage buffer to said selected row in a second clock cycle of the refresh cycle, said first and second clock cycles of the refresh cycle being separated in time by the refresh latency period.

15. A method according to claim 14, in which said first and second clock cycles of the refresh cycle are interspersed among a set of normal read and write cycles.

16. A method according to claim 15, in which said stored contents of an (n−1)th row are written from said storage buffer into said array before the contents of the nth row of said array are read into said storage buffer.

17. A method according to claim 14, in which said stored contents of an (n−1)th row are written from said storage buffer into said array before the contents of the nth row of said array are read into said storage buffer.

18. A method according to claim 14, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

19. A method according to claim 13, in which said stored contents of an (n−1)th row are written from said storage buffer into said array before the contents of the nth row of said array are read into said storage buffer.

20. A method according to claim 13, in which the row address of the (n−1)th row in the storage buffer is compared with the row address of data written into the array during the refresh latency period and the operation of writing back the stored contents of an (n−1)th row of the array from the storage buffer into the cells of the (n−1)th row of the array is suppressed when a write operation has taken place writing data into the (n−1)th row of the array during the latency period.

* * * * *